United States Patent
Chang et al.

(10) Patent No.: US 11,340,641 B2
(45) Date of Patent: May 24, 2022

(54) HYBRID VOLTAGE REGULATOR USING BANDWIDTH SUPPRESSED SERIES REGULATOR AND ASSOCIATED VOLTAGE REGULATING METHOD

(71) Applicant: MEDIATEK INC., Hsin-Chu (TW)

(72) Inventors: Chun-Wei Chang, Hsin-Chu (TW); Song-Yu Yang, Hsin-Chu (TW); Ang-Sheng Lin, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/590,391

(22) Filed: Oct. 2, 2019

(65) Prior Publication Data
US 2020/0142436 A1    May 7, 2020

Related U.S. Application Data

(60) Provisional application No. 62/756,613, filed on Nov. 7, 2018.

(51) Int. Cl.
G05F 1/575 (2006.01)
H03F 3/45 (2006.01)

(52) U.S. Cl.
CPC ......... G05F 1/575 (2013.01); H03F 3/45273 (2013.01)

(58) Field of Classification Search
CPC . G05F 1/57; G05F 1/575; G05F 1/576; G05F 1/08; G05F 1/10; G05F 1/56; G05F 1/563; G05F 1/565; G05F 1/59; G05F 3/02; H03F 3/45273; H03F 3/45
See application file for complete search history.

(56) References Cited

U.S. PATENT DOCUMENTS

| | | | |
|---|---|---|---|
| 6,441,594 B1 | 8/2002 | Connell | |
| 9,383,762 B2 | 7/2016 | Mallinson | |
| 2007/0030054 A1* | 2/2007 | Lee | G05F 1/571 |
| | | | 327/541 |
| 2008/0054861 A1* | 3/2008 | Zlatkovic | G05F 1/56 |
| | | | 323/234 |
| 2013/0307506 A1 | 11/2013 | Oh | |
| 2014/0266118 A1 | 9/2014 | Chern | |

(Continued)

FOREIGN PATENT DOCUMENTS

| | | |
|---|---|---|
| CN | 101350557 A | 1/2009 |
| CN | 101409505 A | 4/2009 |

(Continued)

*Primary Examiner* — Matthew V Nguyen
(74) *Attorney, Agent, or Firm* — Wolf, Greenfield & Sacks, P.C.

(57) ABSTRACT

A voltage regulator provides a load device with a regulated voltage, and includes a first regulator circuit, a second regulator circuit, a first control loop circuit, and a second control loop circuit. The load device and the first regulator circuit are connected in series. The load device and the second regulator circuit are connected in parallel. The first control loop circuit adaptively adjusts a first bias voltage of the first regulator circuit in response to a load condition at the output node of the voltage regulator, wherein the first control loop circuit includes a capacitor coupled between the first power rail and an output node of a feedback amplifier. The second control loop circuit adaptively adjusts a second bias voltage of the second regulator circuit in response to the load condition at the output node of the voltage regulator.

20 Claims, 8 Drawing Sheets

(56) References Cited

U.S. PATENT DOCUMENTS

| | | | |
|---|---|---|---|
| 2015/0177759 A1 | 6/2015 | Mallinson | |
| 2016/0334818 A1* | 11/2016 | Singh | G05F 1/56 |
| 2017/0371364 A1* | 12/2017 | Vareljian | G05F 1/575 |
| 2019/0138043 A1* | 5/2019 | Wang | G05F 3/26 |
| 2020/0225689 A1* | 7/2020 | Vannorsdel | G05F 1/565 |

FOREIGN PATENT DOCUMENTS

| | | |
|---|---|---|
| CN | 101836351 A | 9/2010 |
| CN | 101917116 A | 12/2010 |
| CN | 103516216 A | 1/2014 |
| CN | 105373179 A | 3/2016 |
| CN | 105843312 A | 8/2016 |
| KR | 20140071103 A | 6/2014 |
| TW | 200903972 | 1/2009 |

\* cited by examiner

HYBRID VOLTAGE REGULATOR USING BANDWIDTH SUPPRESSED SERIES REGULATOR AND ASSOCIATED VOLTAGE REGULATING METHOD

CROSS REFERENCE TO RELATED APPLICATIONS

This application claims the benefit of U.S. provisional application No. 62/756,613, filed on Nov. 7, 2018 and incorporated herein by reference.

BACKGROUND

The present invention relates to providing a regulated voltage, and more particularly, to a hybrid voltage regulator using a bandwidth suppressed series regulator and an associated voltage regulating method.

A voltage regulator is used to generate a regulated voltage that is essential for electronic circuitry. For example, the voltage regulator may be implemented by a low dropout (LDO) regulator that is a linear regulator capable of maintaining a constant voltage output through a feedback loop. Linear regulators exist in two basic forms, series regulators and shunt regulators. With regard to a series regulator, it is placed between a voltage source and a load device. With regard to a shunt regulator, it is placed in parallel with a load device. Each of the series regulator and the shunt regulator has advantages and disadvantages. There is a need for an innovative hybrid voltage regulator which can have good power efficiency and high reverse leakage rejection/isolation.

SUMMARY

One of the objectives of the claimed invention is to provide a hybrid voltage regulator using a bandwidth suppressed series regulator and an associated voltage regulating method.

According to a first aspect, an exemplary voltage regulator for providing a load device with a regulated voltage is disclosed. The exemplary voltage regulator includes a first regulator circuit, a second regulator circuit, a first control loop circuit, and a second control loop circuit. The first regulator circuit is coupled between a first power rail and an output node of the voltage regulator, wherein the regulated voltage is generated at the output node of the voltage regulator, and the load device and the first regulator circuit are connected in series. The second regulator circuit is coupled between a second power rail and the output node of the voltage regulator, wherein the load device and the second regulator circuit are connected in parallel. The first control loop circuit is arranged to adaptively adjust a first bias voltage of the first regulator circuit in response to a load condition at the output node of the voltage regulator. The first control loop circuit comprises a feedback amplifier and a capacitor. The feedback amplifier is arranged to generate the first bias voltage at an output node of the feedback amplifier. The capacitor is coupled between the first power rail and the output node of the feedback amplifier. The second control loop circuit is arranged to adaptively adjust a second bias voltage of the second regulator circuit in response to the load condition at the output node of the voltage regulator.

According to a second aspect of the present invention, an exemplary voltage regulating method for providing a load device with a regulated voltage is disclosed. The exemplary voltage regulating method comprises: performing a voltage-mode voltage regulation operation upon the regulated voltage according to a first bias voltage, wherein the regulated voltage is generated at an output node that is coupled to the load device; performing a current-mode voltage regulation operation upon the regulated voltage according to a second bias voltage; adaptively adjusting the first bias voltage of the voltage-mode voltage regulation operation in response to a load condition at the output node, comprising generating, by a feedback amplifier, the first bias voltage at an output node of the feedback amplifier, wherein a capacitor is coupled between a power rail and the output node of the feedback amplifier; and adaptively adjusting the second bias voltage of the current-mode voltage regulation operation in response to the load condition at the output node.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
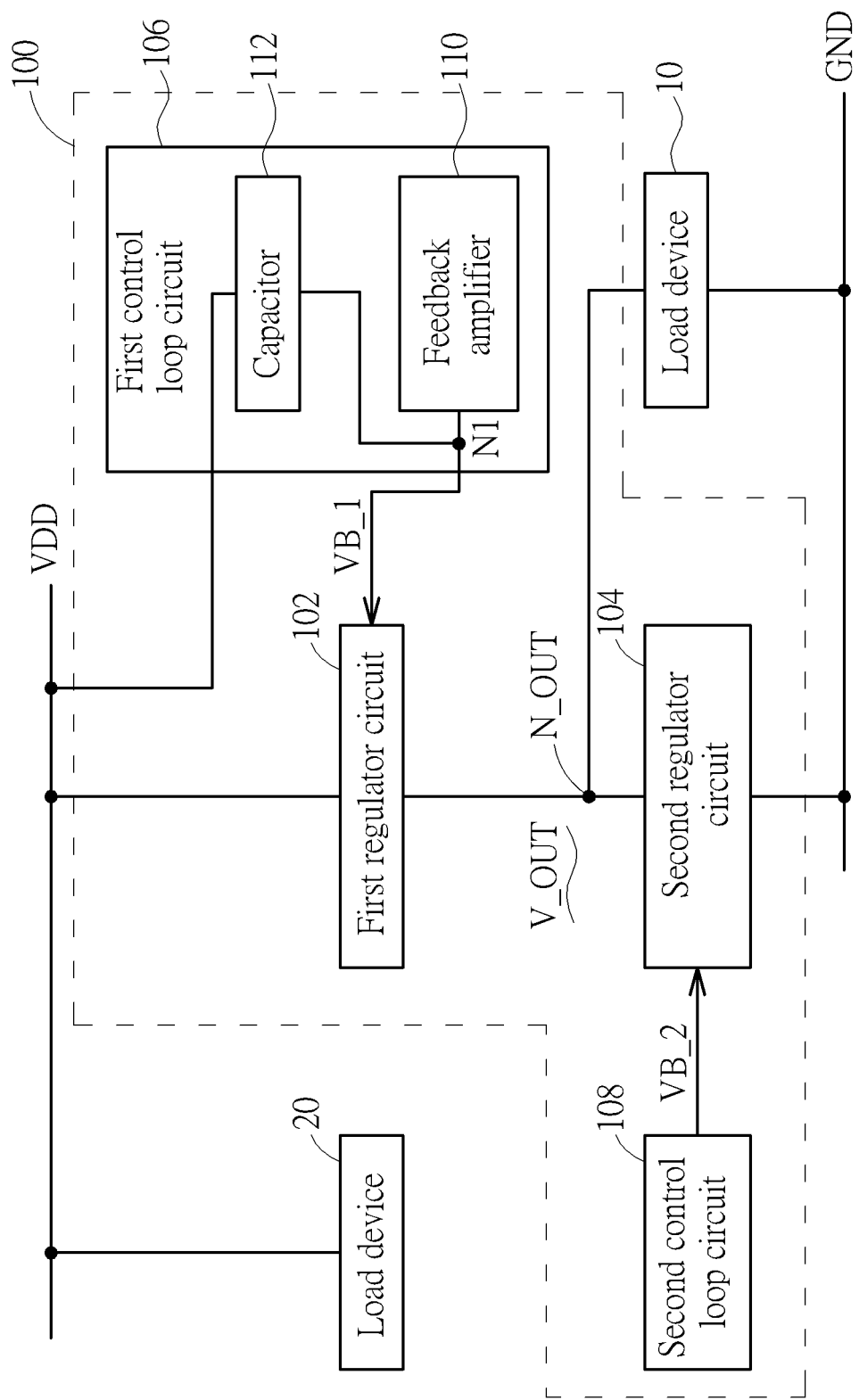
FIG. 1 is a block diagram illustrating a voltage regulator according to an embodiment of the present invention.

FIG. 1 is a block diagram illustrating a voltage regulator according to an embodiment of the present invention. The voltage regulator 100 employs a hybrid LDO regulator design, and thus includes a first regulator circuit 102 and a second regulator circuit 104. The first regulator circuit 102 is coupled between a first power rail VDD and an output node N_OUT of the voltage regulator 100. The second regulator circuit 104 is coupled between a second power rail GND and the output node N_OUT of the voltage regulator 100. In this embodiment, the first power rail VDD is used to deliver a supply voltage, and the second power rail GND is used to deliver a ground voltage. The voltage regulator 100 is used for providing a load device 10 with a regulated voltage V_OUT that is generated at the output node N_OUT. In accordance with the hybrid LDO regulator design, the first regulator circuit 102 is a part of a series regulator such that the load device 10 and the first regulator circuit 102 are connected in series, and the second regulator circuit 104 is a part of a shunt regulator such that the load device 10 and the second regulator circuit 104 are connected in parallel.

The voltage regulator 100 further includes a first control loop circuit 106 and a second control loop circuit 108. A combination of the first regulator circuit 102 and the first control loop circuit 106 acts as one series regulator, where the first bias voltage VB_1 of the first regulator circuit 102 is adaptively adjusted by the first control loop circuit 106 in response to a load condition at the output node N_OUT of the voltage regulator 100. A combination of the second regulator circuit 104 and the second control loop circuit 108 acts as one shunt regulator, where the second bias voltage VB_2 of the second regulator circuit 104 is adaptively adjusted by the second control loop circuit 108 in response to the load condition at the output node N_OUT of the voltage regulator 100.

In this embodiment, the first control loop circuit 106 includes a feedback amplifier 110 and a capacitor 112. The feedback amplifier 110 is arranged to generate the first bias voltage VB_1 at its output node N1. The capacitor 112 may be implemented by a single capacitor or a combination of discrete small-sized capacitors. That is, the present invention has no limitations on the actual implementation of the capacitor 112. As shown in FIG. 1, the capacitor 112 is coupled between the first power rail VDD and the output node N1 of the feedback amplifier 110.

A capacitance value of the capacitor 112 is properly set to thereby achieve the desired bandwidth suppression for the first control loop circuit 106. With a proper setting of the capacitance value of the capacitor 112, a bandwidth of the first control loop circuit 106 is different from a bandwidth of the second control loop circuit 108. For example, the capacitor 112 with a large capacitance value is intentionally introduced to ensure that the bandwidth of the first control loop circuit 106 is much lower than the bandwidth of the second control loop circuit 108. Compared to the second control loop circuit 108 which tracks the load variation at the output node N_OUT and adjusts the second bias voltage VB_2 at a faster speed, the first control loop circuit 106 tracks the load variation at the output node N_OUT and adjusts the first bias voltage VB_1 at a slower speed. Due to the large discrepancy between the bandwidth of the first control loop circuit 106 and the bandwidth of the second control loop circuit 108, the first bias voltage VB_1 adjusted under the bandwidth of the first control loop circuit 106 can be regarded as a constant voltage under the bandwidth of the second control loop circuit 108. In this way, the first regulator circuit 102 may be regarded as a current source for the second regulator circuit 104 under the bandwidth of the second control loop circuit 108. Since the first regulator circuit 102 is coupled to the first power rail VDD, the first regulator circuit 102 is arranged to perform a voltage-mode voltage regulation operation upon the regulated voltage V_OUT according to the first bias voltage VB_1. Since the second regulator circuit 104 is loaded with a current source (e.g., first regulator circuit 102), the second regulator circuit 104 is arranged to perform a current-mode voltage regulation operation upon the regulated voltage V_OUT according to the second bias voltage VB_2. Further details of the proposed hybrid voltage regulator using a series regulator with bandwidth suppression are described as below.

Figure 2:
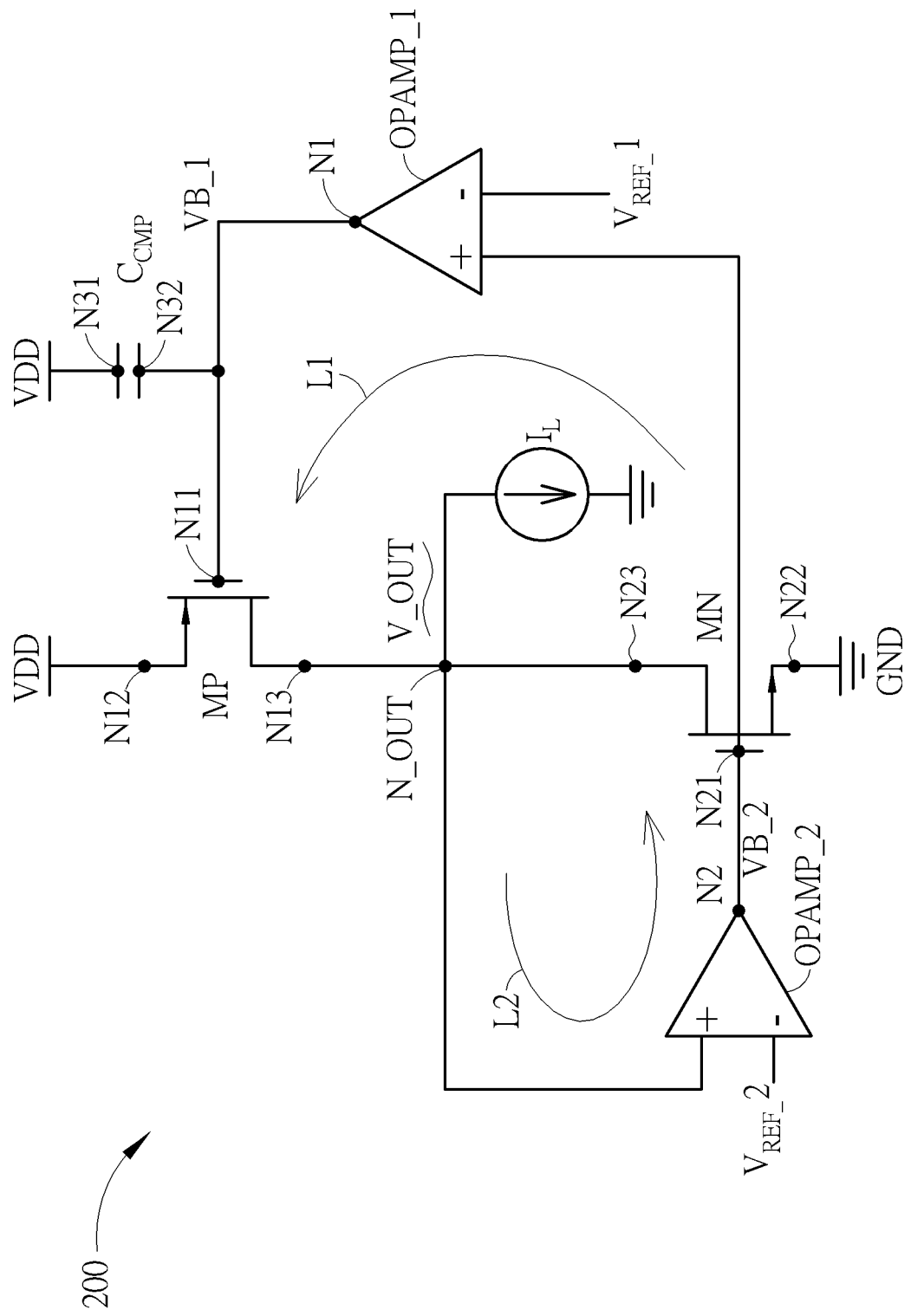
FIG. 2 is a circuit diagram illustrating a first power-efficient voltage regulator with high reverse leakage rejection according to an embodiment of the present invention.

FIG. 2 is a circuit diagram illustrating a first power-efficient voltage regulator with high reverse leakage rejection according to an embodiment of the present invention. The voltage regulator 200 is based on the architecture of the voltage regulator 100 shown in FIG. 1. That is, the voltage regulator 100 may be implemented using the voltage regulator 200. For example, the first regulator circuit 102 may be implemented by a P-channel metal oxide semiconductor (PMOS) transistor MP, the second regulator circuit 104 may be implemented by an N-channel metal oxide semiconductor (NMOS) transistor MN, the second control loop circuit 108 may be implemented by an operational amplifier OPAMP_2, the feedback amplifier 110 of the first control loop circuit 106 may be implemented by an operational amplifier OPAMP_1, and the capacitor 112 of the first control loop circuit 106 may be implemented by a capacitor $C_{CMP}$).

Regarding the PMOS transistor MP, a control terminal (i.e., gate) N11 is coupled to an output node N1 of the operational amplifier OPAMP_1, a first connection terminal (i.e., source) N12 is coupled to the first power rail VDD (which provides a supply voltage), and a second connection terminal (i.e., drain) N13 is coupled to the output node N_OUT of the voltage regulator 200.

Regarding the NMOS transistor MN, a control terminal (i.e., gate) N21 is coupled to an input node of the operational amplifier OPAMP_1 and an output node N2 of the operational amplifier OPAMP_2, a first connection terminal (i.e., source) N22 is coupled to the second power rail GND (which provides a ground voltage), and a second connection terminal (i.e., drain) N23 is coupled to the output node N_OUT of the voltage regulator 200.

The operational amplifier OPAMP_2 is a differential input, single-ended output amplifier having a non-inverting input node (+) arranged to receive the regulated voltage V_OUT generated at the output node N_OUT of the voltage regulator 200 and an inverting input node (−) arranged to receive a reference voltage $V_{REF}\_2$, where an output voltage generated at the output node N2 acts as the second bias voltage VB_2 supplied to the control terminal N21 of the NMOS transistor MN. In this example, the operational amplifier OPAMP_1 is a differential input, single-ended output amplifier having a non-inverting input node (+) arranged to receive the output voltage generated from the operational amplifier OPAMP_1 and an inverting input node (−) arranged to receive a reference voltage $V_{REF}\_1$, where an output voltage generated at the output node N1 acts as the first bias voltage VB_1 supplied to the control terminal N11 of the PMOS transistor MP.

A first end N31 and a second end N32 of the capacitor $C_{CMP}$ are coupled to the first power rail VDD and the control terminal N11 of the PMOS transistor MP, respectively. A capacitance value of the capacitor $C_{CMP}$ is properly set to ensure that a bandwidth of a first control loop L1 (which is realized by capacitor $C_{CMP}$ and operational amplifier OPAMP_1) is much lower than a bandwidth of a second control loop L2 (which is realized by operational amplifier OPAMP_2). By way of example, but not limitation, the bandwidth of the first control loop L1 is in an order of Kilo Hertz (KHz), and the bandwidth of the second control loop L2 is in an order of Mega Hertz (MHz). Due to the large discrepancy between the low bandwidth of the first control loop L1 and the high bandwidth of the second control loop L2, the first bias voltage VB_1 slowly adjusted under the low bandwidth of the first control loop L1 is regarded as a constant voltage under the high bandwidth of the second control loop L2, such that the PMOS transistor MP is regarded as a current source for the NMOS transistor MN under the high bandwidth of the second control loop L2. Since the NMOS transistor MN is loaded with a current source, a current-mode voltage regulator is achieved and has strong reverse power supply rejection ratio (PSRR) to block the leakage current introduced by the load device 10 from affecting other load device 20 powered by the first power rail VDD. For example, the load device 10 may be a digital intensive circuit such as a time to digital converter (TDC) which operates according to a reference clock, and the load device 20 may be a supply-sensitive circuit. A time-variant load current $I_L$ is drawn from the output node N_OUT by the load device 10 due to the fact that the load device 10 includes clock-based processing circuit(s). Since the PMOS transistor MP (which is controlled by a low-bandwidth loop) acts as a current source for the NMOS transistor MN (which is controlled by a high-bandwidth loop), the required reverse leakage isolation is provided by the PMOS transistor MP.

In this embodiment, the first end N31 of the capacitor $C_{CMP}$ is directly connected to the first power rail VDD (which is directly connected to the first connection terminal N12 of the PMOS transistor MP), and the second end N32 of the capacitor $C_{CMP}$ is directly connected to the control terminal N11 of the PMOS transistor MP. Hence, the capacitor $C_{CMP}$ acts as an alternating current (AC) shorted circuit from the source to the gate of the PMOS transistor MP that is a part of the series regulator. This would improve the PSRR performance. Furthermore, the operational amplifier OPAMP_1 can be configured to have a gain larger than a unity gain. In this way, the PSRR performance can be further improved. To put it another way, the in-band PSRR can be improved due to gain contribution from the control loop.

In a typical shunt regulator design, the control loop L1 is absent, and a fixed bias voltage is applied to the control terminal N11 of the PMOS transistor MP for enforcing the PMOS transistor MP to provide a large constant current not smaller than a maximum load current $I_L$ that may be drawn from the load device 10. Hence, the PMOS transistor MP consumes large power to cover the load variation under process corner and temperature. The present invention proposes using the control loop L1 to adaptively track the output load (e.g., load current $I_L$) and adjust the first bias voltage VB_1. Since the first bias voltage VB_1 is adaptively adjusted in response to a load condition, the power consumption of the PMOS transistor MP can be reduced. In this way, the power efficiency of the voltage regulator with high reverse leakage rejection/isolation can be improved. To put it simply, the proposed voltage regulator 200 is a power-efficient LDO regulator with high reverse PSRR.

It should be noted that the reference voltage $V_{REF\_1}$ provided to the operational amplifier OPAMP_1 can also control the transconductance ($g_m$) parameter of the NMOS transistor MN that is a part of the shunt regulator. Hence, the bandwidth of the control loop L2 can be tuned by the setting of the reference voltage $V_{REF\_1}$. However, this is for illustrative purposes only, and is not meant to be a limitation of the present invention.

Figure 3:
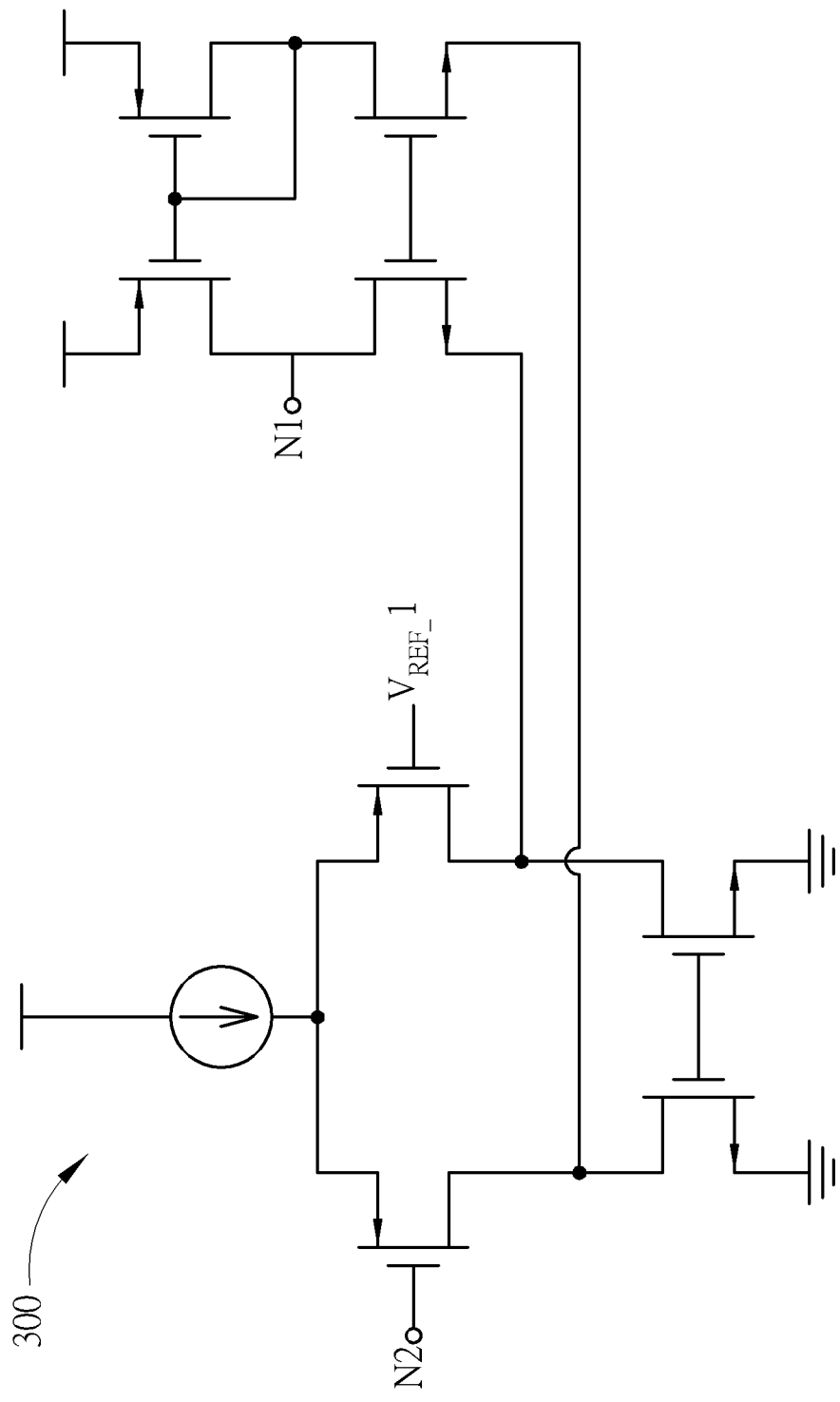
FIG. 3 is a circuit diagram illustrating a first differential input, single-ended output amplifier according to an embodiment of the present invention.
Figure 4:
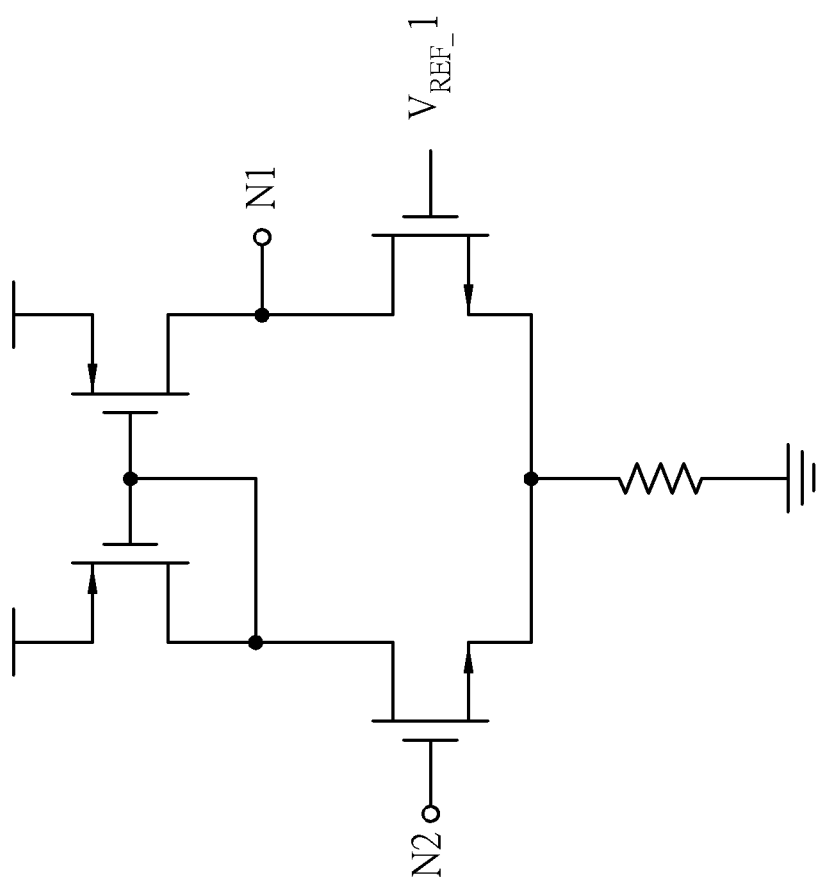
FIG. 4 is a circuit diagram illustrating a second differential input, single-ended output amplifier according to an embodiment of the present invention.

As shown in FIG. 2, the operational amplifier OPAMP_1 is a differential input, single-ended output amplifier. FIG. 3 is a circuit diagram illustrating a first differential input, single-ended output amplifier according to an embodiment of the present invention. FIG. 4 is a circuit diagram illustrating a second differential input, single-ended output amplifier according to an embodiment of the present invention. The operational amplifier OPAMP_1 shown in FIG. 2 may be implemented by one of the differential input, single-ended output amplifiers 300 and 400, depending upon the actual design considerations.

Figure 5:
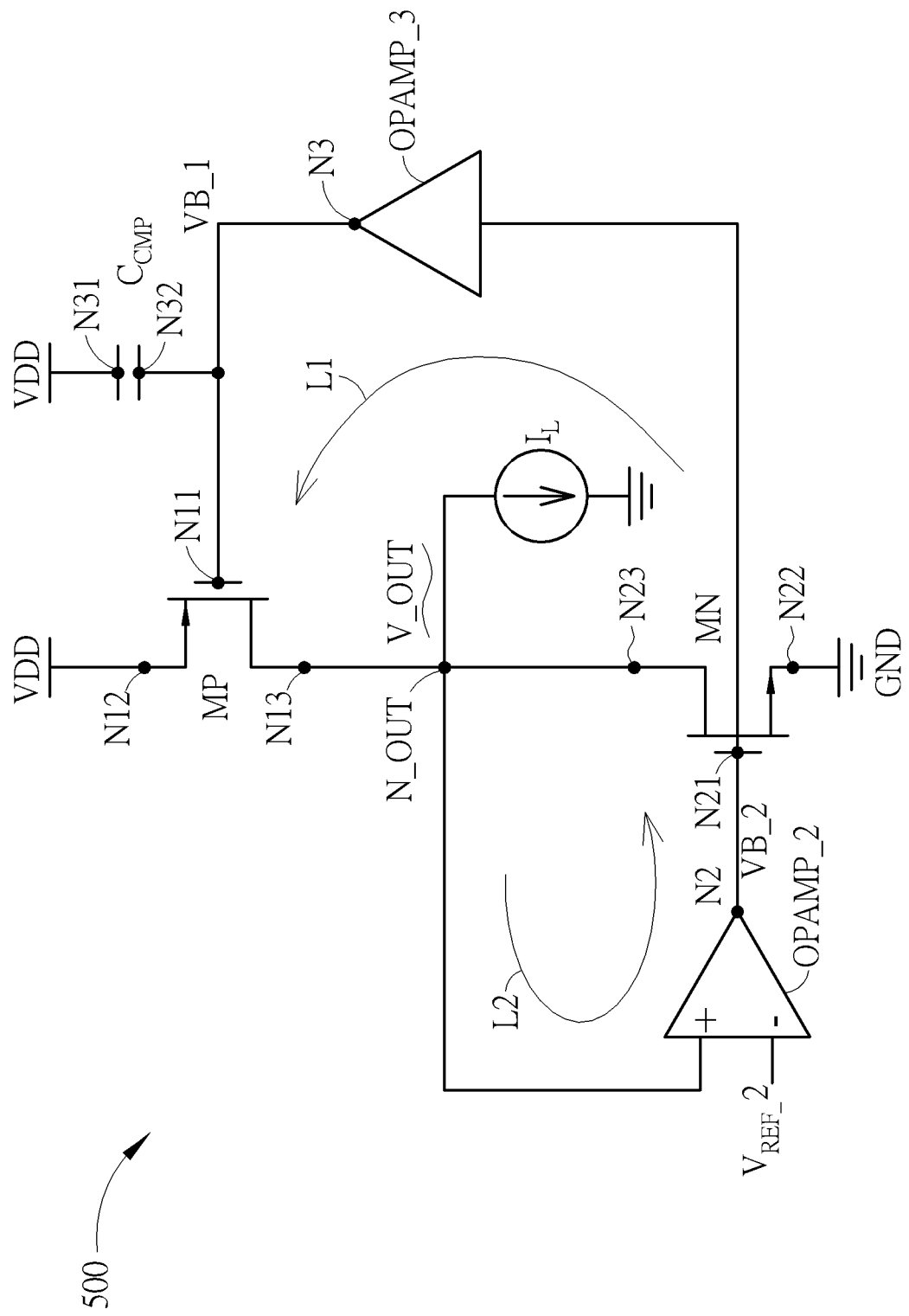
FIG. 5 is a circuit diagram illustrating a second power-efficient voltage regulator with high reverse leakage rejection according to an embodiment of the present invention.

FIG. 5 is a circuit diagram illustrating a second power-efficient voltage regulator with high reverse leakage rejection according to an embodiment of the present invention. Like the voltage regulator 200 shown in FIG. 2, the voltage regulator 500 is also based on the architecture of the voltage regulator 100 shown in FIG. 1. That is, the voltage regulator 100 may be implemented using the voltage regulator 500. For example, the first regulator circuit 102 may be implemented by a PMOS transistor MP, the second regulator circuit 104 may be implemented by an NMOS transistor MN, the second control loop circuit 108 may be implemented by an operational amplifier OPAMP_2, the feedback amplifier 110 of the first control loop circuit 106 may be implemented by an operational amplifier OPAMP_3, and the capacitor 112 of the first control loop circuit 106 may be implemented by a capacitor $C_{CMP}$. The major difference between the voltage regulators 200 and 500 is that the operational amplifier OPAMP_3 is a single-ended input, single-ended output amplifier. Hence, the operational amplifier OPAMP_3 generates the first bias voltage VB_1 at its output node N3 according to the voltage output at the output node N2 of the operational amplifier OPAMP_2, where the voltage output at the output node N2 of the operational amplifier OPAMP_2 also serves as the second bias voltage VB_2.

Figure 6:
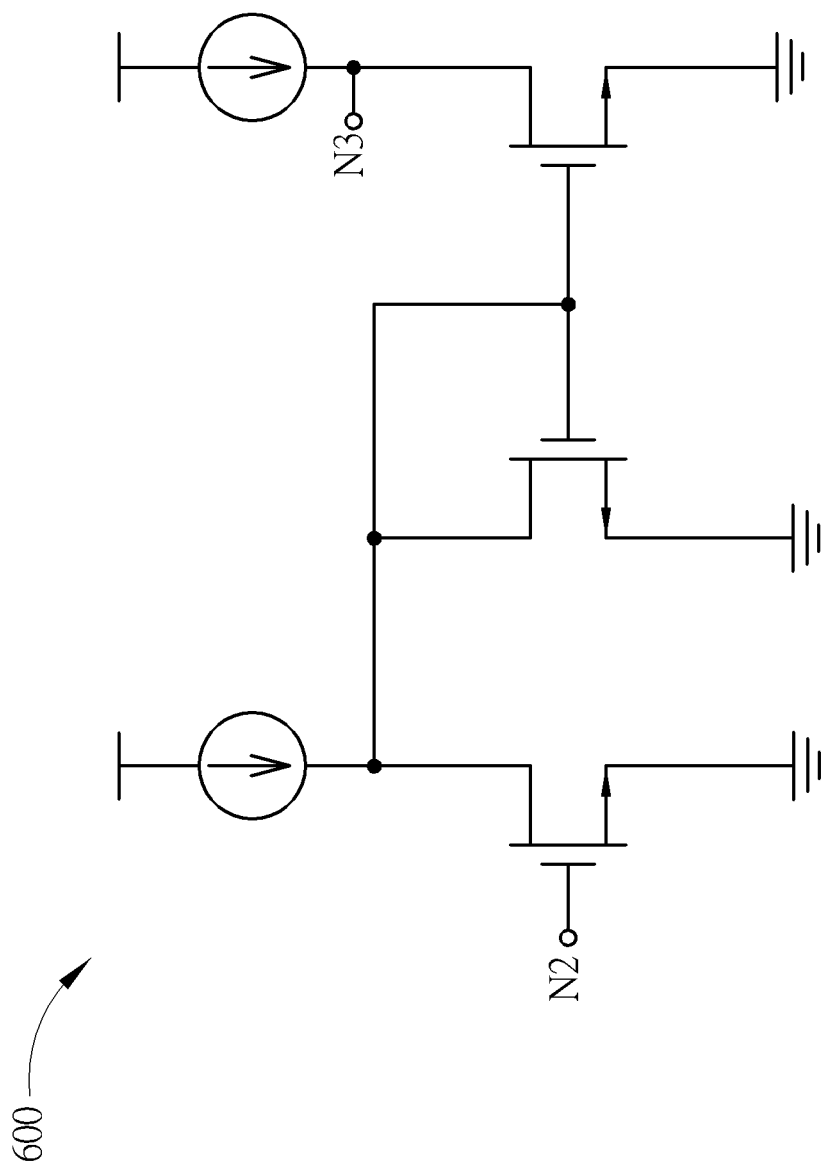
FIG. 6 is a circuit diagram illustrating a first single-ended input, single-ended output amplifier according to an embodiment of the present invention.
Figure 7:
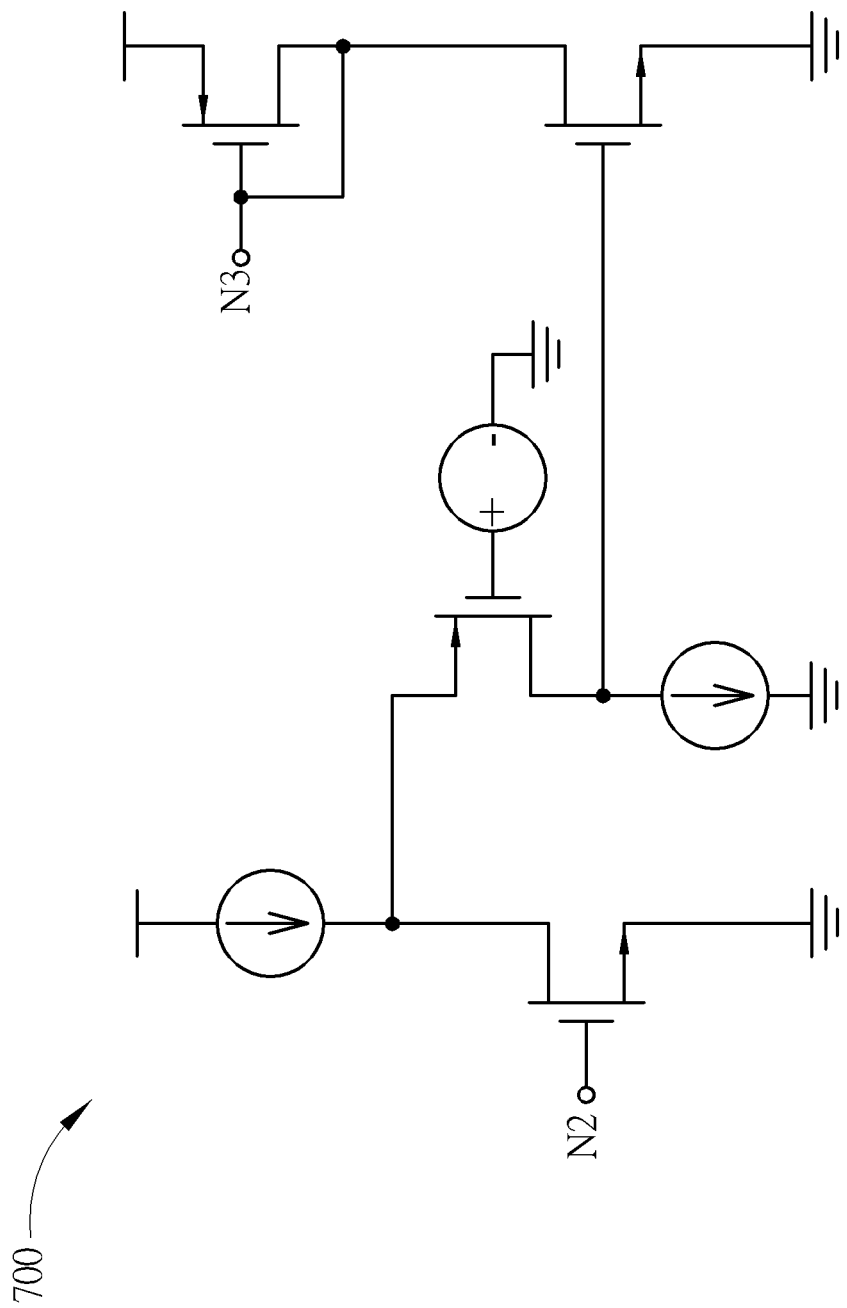
FIG. 7 is a circuit diagram illustrating a second single-ended input, single-ended output amplifier according to an embodiment of the present invention.
Figure 8:
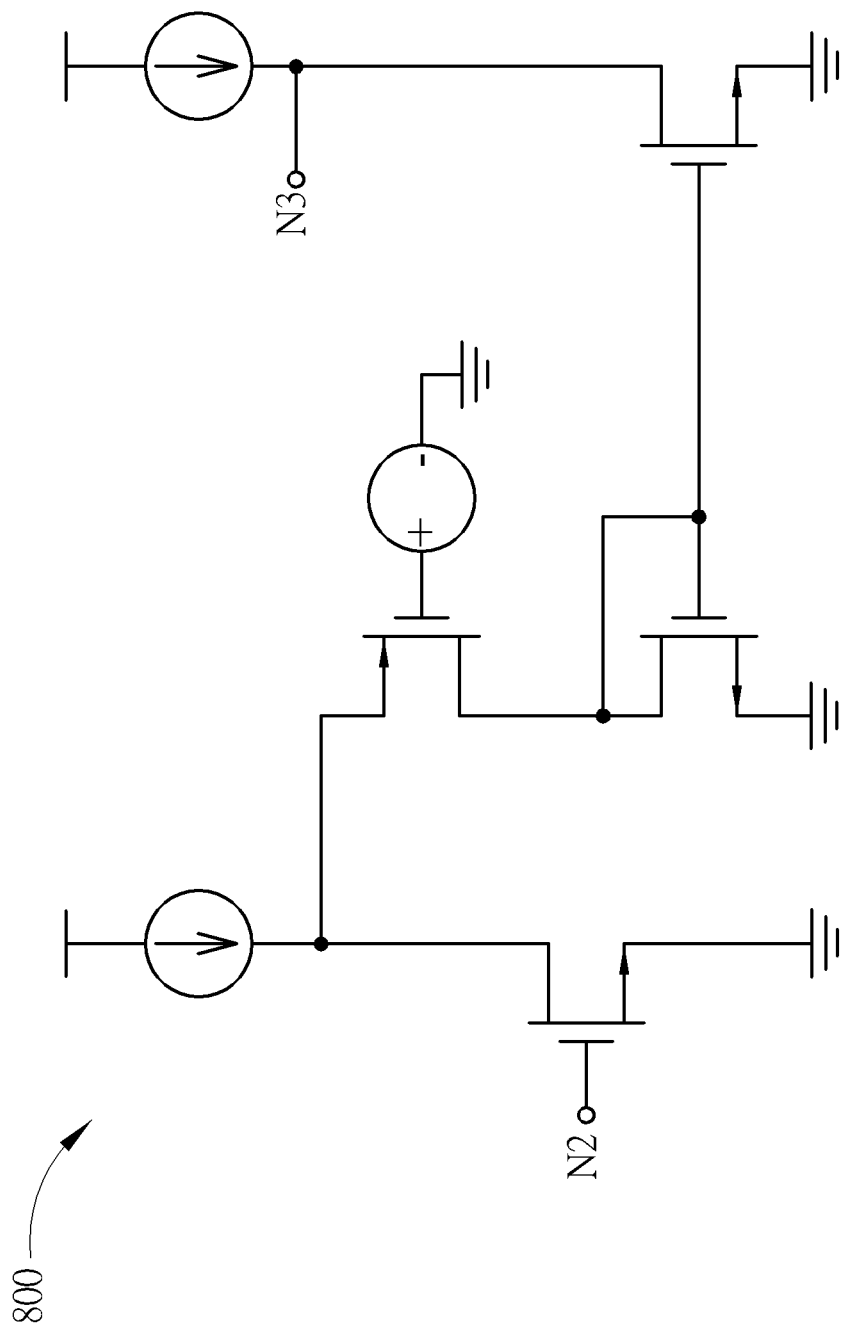
FIG. 8 is a circuit diagram illustrating a third single-ended input, single-ended output amplifier according to an embodiment of the present invention.

FIG. 6 is a circuit diagram illustrating a first single-ended input, single-ended output amplifier according to an embodiment of the present invention. FIG. 7 is a circuit diagram illustrating a second single-ended input, single-ended output amplifier according to an embodiment of the present invention. FIG. 8 is a circuit diagram illustrating a third single-ended input, single-ended output amplifier according to an embodiment of the present invention. The operational amplifier OPAMP_3 shown in FIG. 5 may be implemented by one of the single-ended input, single-ended output amplifiers 600, 700, and 800, depending upon the actual design considerations.

Since a person skilled in the pertinent art can readily understand the operation and function of the voltage regulator 500 after reading above paragraphs directed to the voltage regulator 200, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage regulator for providing a load device with a regulated voltage, comprising:
   a first regulator circuit, coupled between a first power rail and an output node of the voltage regulator, wherein the regulated voltage is generated at the output node of the voltage regulator, and the load device and the first regulator circuit are connected in series;

a second regulator circuit, coupled between a second power rail and the output node of the voltage regulator, wherein the load device and the second regulator circuit are connected in parallel;

a first control loop circuit, arranged to adaptively adjust a first bias voltage of the first regulator circuit in response to a load condition at the output node of the voltage regulator, wherein the first control loop circuit comprises:
  a feedback amplifier, arranged to generate the first bias voltage at an output node of the feedback amplifier wherein the feedback amplifier is configured to have a gain larger than a unity gain; and
  a capacitor, coupled between the first power rail and the output node of the feedback amplifier; and
a second control loop circuit, arranged to adaptively adjust a second bias voltage of the second regulator circuit in response to the load condition at the output node of the voltage regulator,
wherein the feedback amplifier has an inverting input connected to receive a reference voltage.

2. The voltage regulator of claim 1, wherein the first regulator circuit comprises:
  a transistor, having a control terminal, a first connection terminal, and a second connection terminal, wherein the control terminal is arranged to receive the first bias voltage, the first connection terminal is coupled to the first power rail, and the second connection terminal is coupled to the output node of the voltage regulator;
  wherein a first end and a second end of the capacitor are coupled to the first power rail and the control terminal of the transistor, respectively.

3. The voltage regulator of claim 1, wherein the feedback amplifier is a single-ended input, single-ended output amplifier.

4. The voltage regulator of claim 1, wherein the feedback amplifier is a differential input, single-ended output amplifier.

5. The voltage regulator of claim 1, wherein a bandwidth of the first control loop circuit is different from a bandwidth of the second control loop circuit.

6. The voltage regulator of claim 1, wherein the load device is a digital intensive circuit.

7. The voltage regulator of claim 2, wherein the first end of the capacitor is directly connected to the first power rail, and the second end of the capacitor is directly connected to the control terminal of the transistor.

8. The voltage regulator of claim 5, wherein the bandwidth of the first control loop circuit is lower than the bandwidth of the second control loop circuit.

9. The voltage regulator of claim 8, wherein the first regulator circuit comprises:
  a transistor, having a control terminal, a first connection terminal, and a second connection terminal, wherein the control terminal is arranged to receive the first bias voltage, the first connection terminal is coupled to the first power rail, and the second connection terminal is coupled to the output node of the voltage regulator;
  wherein due to discrepancy between the bandwidth of the first control loop circuit and the bandwidth of the second control loop circuit, the first bias voltage adjusted under the bandwidth of the first control loop circuit is regarded as a constant voltage under the bandwidth of the second control loop circuit.

10. The voltage regulator of claim 9, wherein the transistor is regarded as a current source for the second regulator circuit under the bandwidth of the second control loop circuit.

11. A voltage regulating method for providing a load device with a regulated voltage, comprising:
  performing a voltage-mode voltage regulation operation upon the regulated voltage according to a first bias voltage, wherein the regulated voltage is generated at an output node that is coupled to the load device;
  performing a current-mode voltage regulation operation upon the regulated voltage according to a second bias voltage;
  adaptively adjusting the first bias voltage of the voltage-mode voltage regulation operation in response to a load condition at the output node, comprising:
    generating, by a feedback amplifier, the first bias voltage at an output node of the feedback amplifier, wherein a capacitor is coupled between a power rail and the output node of the feedback amplifier and the feedback amplifier is configured to have a gain larger than a unity gain; and
  adaptively adjusting the second bias voltage of the current-mode voltage regulation operation in response to the load condition at the output node,
  wherein the feedback amplifier has an inverting input connected to receive a reference voltage.

12. The voltage regulating method of claim 11, wherein the voltage-mode voltage regulation operation is performed by a regulator circuit comprising:
  a transistor, having a control terminal, a first connection terminal, and a second connection terminal, wherein the control terminal is arranged to receive the first bias voltage, the first connection terminal is coupled to the power rail, and the second connection terminal is coupled to the output node;
  wherein a first end and a second end of the capacitor are coupled to the power rail and the control terminal of the transistor, respectively.

13. The voltage regulating method of claim 11, wherein the feedback amplifier is a single-ended input, single-ended output amplifier.

14. The voltage regulating method of claim 11, wherein the feedback amplifier is a differential input, single-ended output amplifier.

15. The voltage regulating method of claim 11, wherein a first loop bandwidth of adaptively adjusting the first bias voltage of the voltage-mode voltage regulation operation is different from a second loop bandwidth of adaptively adjusting the second bias voltage of the current-mode voltage regulation operation.

16. The voltage regulating method of claim 11, wherein the load device is a digital intensive circuit.

17. The voltage regulating method of claim 12, wherein the first end of the capacitor is directly connected to the power rail, and the second end of the capacitor is directly connected to the control terminal of the transistor.

18. The voltage regulating method of claim 15, wherein the first loop bandwidth is lower than the second loop bandwidth.

19. The voltage regulating method of claim 18, wherein the voltage-mode voltage regulation operation is performed by a regulator circuit comprising:
  a transistor, having a control terminal, a first connection terminal, and a second connection terminal, wherein the control terminal is arranged to receive the first bias voltage, the first connection terminal is coupled to the power rail, and the second connection terminal is coupled to the output node of a voltage regulator;

wherein due to discrepancy between the first loop bandwidth and the second loop bandwidth, the first bias voltage adjusted under the first loop bandwidth is regarded as a constant voltage under the second loop bandwidth.

20. The voltage regulating method of claim 19, wherein the transistor is regarded as a current source for the current-mode voltage regulation operation under the second loop bandwidth.

* * * * *